(12) United States Patent
Woo

(10) Patent No.: US 8,624,670 B2
(45) Date of Patent: Jan. 7, 2014

(54) METHOD AND APPARATUS FOR IMPROVING DIGITAL PRE-DISTORTION PERFORMANCE

(75) Inventor: Young-Yoon Woo, Hwaseong-si (KR)

(73) Assignee: Samsung Electronics Co., Ltd (KR)

( * ) Notice: Subject to any disclaimer, the term of this patent is extended or adjusted under 35 U.S.C. 154(b) by 134 days.

(21) Appl. No.: 13/301,200

(22) Filed: Nov. 21, 2011

(65) Prior Publication Data

US 2012/0133434 A1 May 31, 2012

(30) Foreign Application Priority Data

Nov. 25, 2010 (KR) .................. 10-2010-0117855

(51) Int. Cl.
*H03F 1/26* (2006.01)

(52) U.S. Cl.
USPC ............ 330/149; 330/284; 330/135; 330/129

(58) Field of Classification Search
USPC ................................ 330/149, 284, 135, 129
See application file for complete search history.

(56) References Cited

U.S. PATENT DOCUMENTS

| | | | |
|---|---|---|---|
| 6,496,062 B1* | 12/2002 | Nitz et al. ................... | 330/52 |
| 6,985,033 B1* | 1/2006 | Shirali et al. ................ | 330/149 |
| 7,259,630 B2* | 8/2007 | Bachman et al. ............ | 330/297 |
| 8,249,540 B1* | 8/2012 | Gupta et al. ................. | 455/296 |
| 2004/0142667 A1* | 7/2004 | Lochhead et al. ........... | 455/114.3 |
| 2007/0164818 A1* | 7/2007 | Horiguchi et al. .......... | 330/124 R |
| 2011/0255636 A1* | 10/2011 | Ashita et al. ................ | 375/297 |

\* cited by examiner

*Primary Examiner* — Patricia Nguyen
(74) *Attorney, Agent, or Firm* — The Farrell Law Firm, P.C.

(57) ABSTRACT

A digital pre-distortion system and method are provided. The method includes performing a digital pre-distortion operation; and limiting an input of the power amplifier to be no greater than a limit threshold.

12 Claims, 8 Drawing Sheets

METHOD AND APPARATUS FOR IMPROVING DIGITAL PRE-DISTORTION PERFORMANCE

PRIORITY

This application claims priority under 35 U.S.C. §119(a) to Korean patent application Serial No. 10-2010-0117855, which was filed in the Korean Intellectual Property Office on Nov. 25, 2010, the entire disclosure of which is hereby incorporated by reference.

BACKGROUND OF THE INVENTION

1. Field of the Invention

The present invention relates generally to a Digital Pre-Distorter (DPD) of a power amplifier, and more particularly, to a method and an apparatus for improving stability and performance of a DPD by adding a Saturation Level Limiter (SLL) to the DPD and preventing saturation of an output peak signal of a power amplifier.

2. Description of the Related Art

FIG. 1 is a block diagram illustrating a conventional digital pre-distortion system utilizing a digital linearization.

Referring to FIG. 1, a Digital Pre-Distorter (DPD) 110 of a digital unit 100 compares an input signal with an output signal in order to linearize an output of a power amplifier 120, minimizes a distortion component of an output signal, and allows an input modulation signal to be linearly amplified.

To perform extraction of a distortion component of the power amplifier 120 and perform a correction algorithm of a corrector 135 for an operation of the DPD 110, an input signal representing an entire signal and an output signal thereto are required. That is, the corrector 135 receives an input signal and an output signal of a down-converter 130, and provides a coefficient for digital pre-distortion to the DPD 110. Basically, the coefficient sets the DPD 110 gain such that the overall combination response of the power amplifier 120 and the DPD 110 becomes a linear system. This means that the DPD 110 is actually acting as an inverse power amplifier non-linearity pre-equalizer.

An up-converter 115 up-converts an output signal of the DPD 110 to provide the up-converted signal to the power amplifier 120, and the down-converter 130 down-converts an output signal of an attenuator 125, which attenuates an output signal of the power amplifier 120 by a predetermined level, to provide the down-converted signal to the corrector 135.

FIG. 2 illustrates a conventional power amplifier and a conventional power amplifier in a digital pre-distortion transmission system. Specifically, FIG. 2 illustrates a conventional power amplifier 150 with no digital pre-distortion operation applied to the input thereof and a power amplifier 120 with digital a digital pre-distortion operation applied to the input thereof by DPD 110.

When the gains of power amplifiers 150 and 120 are normalized to 1, input/output characteristics for ports 1, 2, 3, and 4 are illustrated in FIG. 3.

FIG. 3 is a graph illustrating input/output characteristics of the conventional digital amplifiers illustrated in FIG. 2.

Referring to FIG. 3, a solid line A represents the input/output characteristics ([1]:[2] before linearization, [3]:[4] after linearization) of the power amplifiers 150 and 120.

When an inverse function of these input/output characteristics is determined, a curve like a dotted line C is obtained. This curve represents input/output characteristics ([1]:[3]) of the DPD. When an input signal [1] is applied, an output signal of the DPD becomes [3]. An output signal of the power amplifier to which the signal [3] has been input becomes a signal [4] that has been linearized for the signal [1].

A solid line B represents an input/output characteristic [1]:[4] of a system after linearization. A saturation power level $P_{OUT\_sat}$ of the power amplifier may be known via a power amplifier input/output signal [3]:[4] after linearization.

The saturation power level $P_{OUT\_sat}$ of the power amplifier is a value whose gain has dropped down by $G_{comp}$ (gain compression) compared to an output value when distortion of the power amplifier does not exist.

Examination of X-axis of a solid line B via the saturation power level $P_{OUT\_sat}$ of the power amplifier shows a system linearization input threshold $P_{IN\_th}$ (input power threshold value) that can be linearized. In a system input value of more than the $P_{IN\_th}$, an output after linearization is saturated like the solid line B.

Upon occurrence of a saturation phenomenon, when linearization iteration time of the DPD is increased, a saturation phenomenon of the power amplifier increases like a dotted line of the end portion of the solid line A.

Due to this, the DPD obtains a more accurate inverse function and so has a steeper slope in a region exceeding $P_{IN\_th}$ as in the dotted line C (DPD input/output characteristics) of the drawing.

FIG. 4 is a graph illustrating input/output characteristics of the conventional digital amplifiers illustrated in FIG. 2, when a system input value of $P_{IN\_th}$ or more is applied.

Referring to FIG. 4, when the system input value $P_{IN}$ becomes a linearization input threshold value $P_{IN\_th}$, an input greater than or equal to a saturation input power level $P_{IN\_PA\_sat}$ is applied to the power amplifier by an output of the DPD. Accordingly, an output of the power amplifier after the linearization is saturated.

When an inverse function is determined via input/output characteristics of the saturated power amplifier, DPD output values steeply rise in a region exceeding $P_{IN\_th}$, as illustrated in the dotted line C of the drawing.

Accordingly, an input value of the power amplifier increases again, and this process iterates, such that a saturation region of the amplifier continues to expand.

When an input value of the amplifier continues to rise, an average input power of the amplifier increases, and consequently, an average output power of the amplifier increases and a divergence phenomenon is caused, creating instability in the digital pre-distortion transmission system.

As described above, in a conventional digital pre-distortion system, when an input greater than a predetermined level is given, an input peak level of a power amplifier gradually increases, when saturation occurs at the power amplifier. Consequently, an average output power rises, causing a divergence phenomenon.

The divergence phenomenon has a very bad influence on the stability and performance of a secure transmission system.

SUMMARY OF THE INVENTION

The present invention has been designed to address at least the problems and/or disadvantages described above and to provide at least the advantages described below Accordingly, an aspect of the present invention is to provide a digital pre-distortion method and an apparatus with improved performance by limiting an input of a power amplifier to be no greater than a limit threshold.

Another aspect of the present invention is to provide a method and an apparatus for raising stability and performance of a digital pre-distortion system by preventing a saturation phenomenon of a power amplifier.

In accordance with an aspect of the present invention, a method for operating a digital pre-distortion system including a power amplifier is provided. The method includes performing a digital pre-distortion operation; and limiting an input of the power amplifier to be no greater than a limit threshold.

In accordance with another aspect of the present invention, an apparatus for operating a digital pre-distortion system is provided. The apparatus includes a power amplifier; a Digital Pre-Distorter (DPD) for performing a digital pre-distortion operation; and a controller for limiting an input of the power amplifier to be no greater than a limit threshold.

BRIEF DESCRIPTION OF THE DRAWINGS

The above and other aspects, features, and advantages of certain embodiments of the present invention will be more apparent from the following description taken in conjunction with the accompanying drawings, in which.

Throughout the drawings, like reference numerals will be understood to refer to like parts, components, and structures.

DETAILED DESCRIPTION OF EXEMPLARY EMBODIMENTS

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

The terms and words used in the following description and claims are not limited to their dictionary meanings, but, are merely used by the inventor to enable a clear and consistent understanding of the invention. Accordingly, it should be apparent to those skilled in the art that the following description is provided for illustration purpose only and not for the purpose of limiting the invention as will defined by the appended claims and their equivalents.

Various embodiments of the present invention will be described below, which provide a digital pre-distortion method and apparatus with improved performance by limiting an input level of a power amplifier to be no greater than a limiting threshold value. In the following description, pre-distortion denotes digital pre-distortion.

Figure 5:
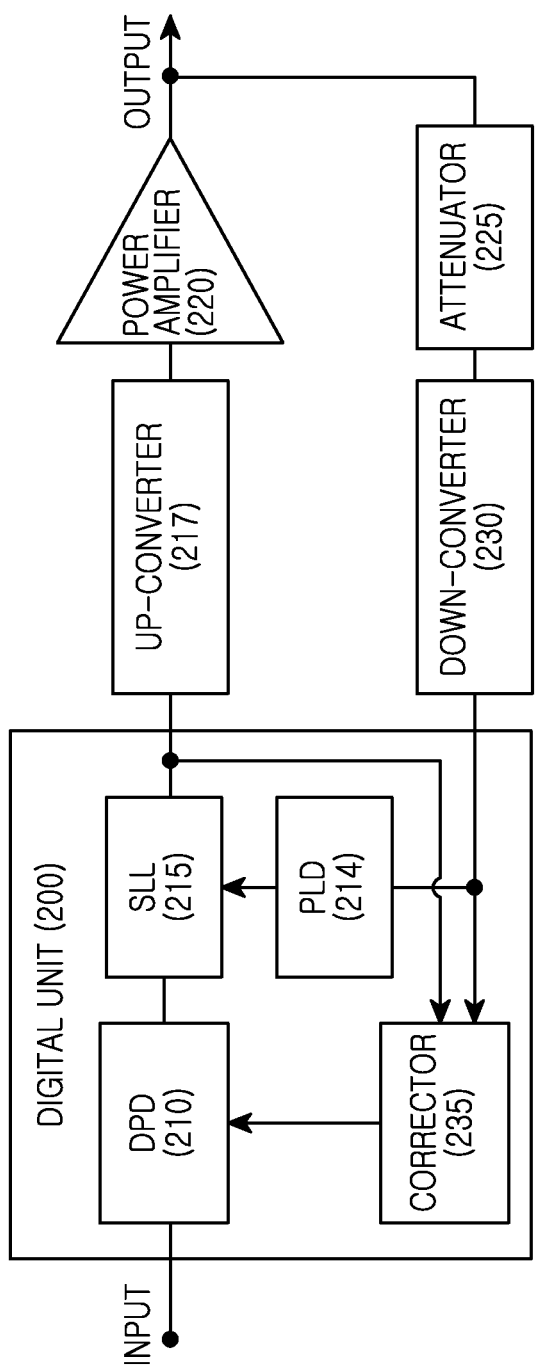
FIG. 5 is a block diagram illustrating a digital pre-distortion system according to an embodiment of the present invention.

FIG. 5 is a block diagram illustrating a digital pre-distortion system according to an embodiment of the present invention.

Figure 1:
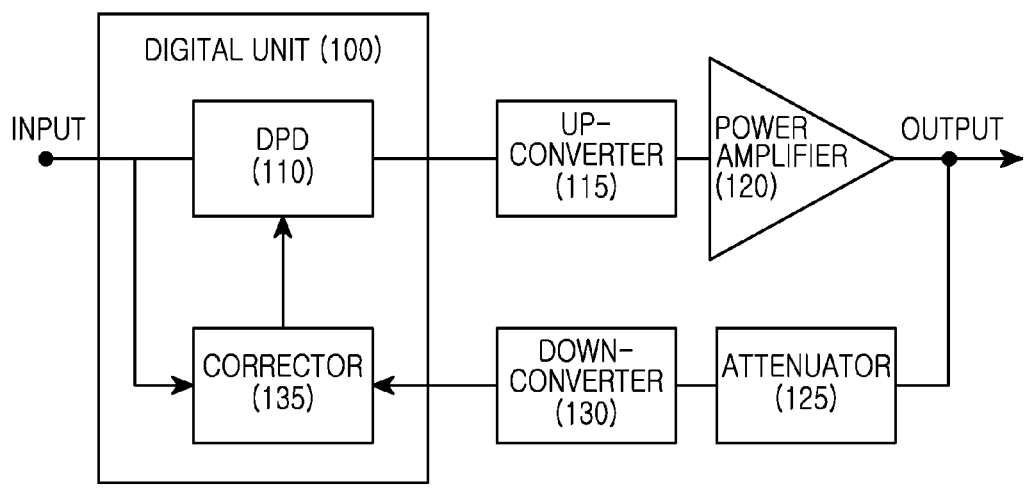
FIG. 1 is a block diagram illustrating a conventional digital pre-distortion system utilizing digital linearization.
Figure 2:
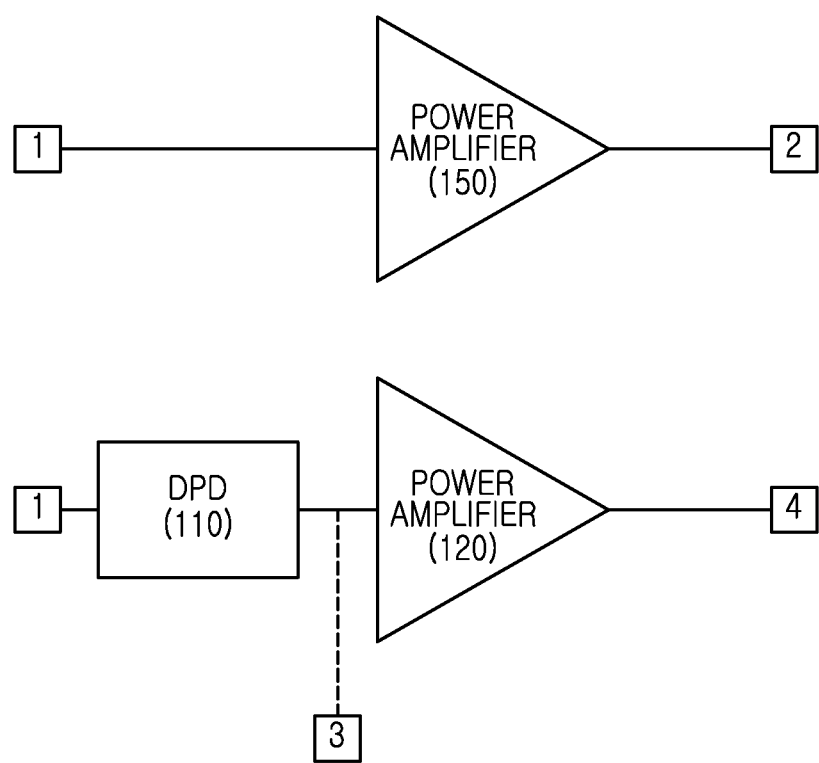
FIG. 2 illustrates a conventional power amplifier with no digital pre-distortion operation applied to the input thereof and a conventional power amplifier with digital a digital pre-distortion operation applied to the input thereof.
Figure 3:
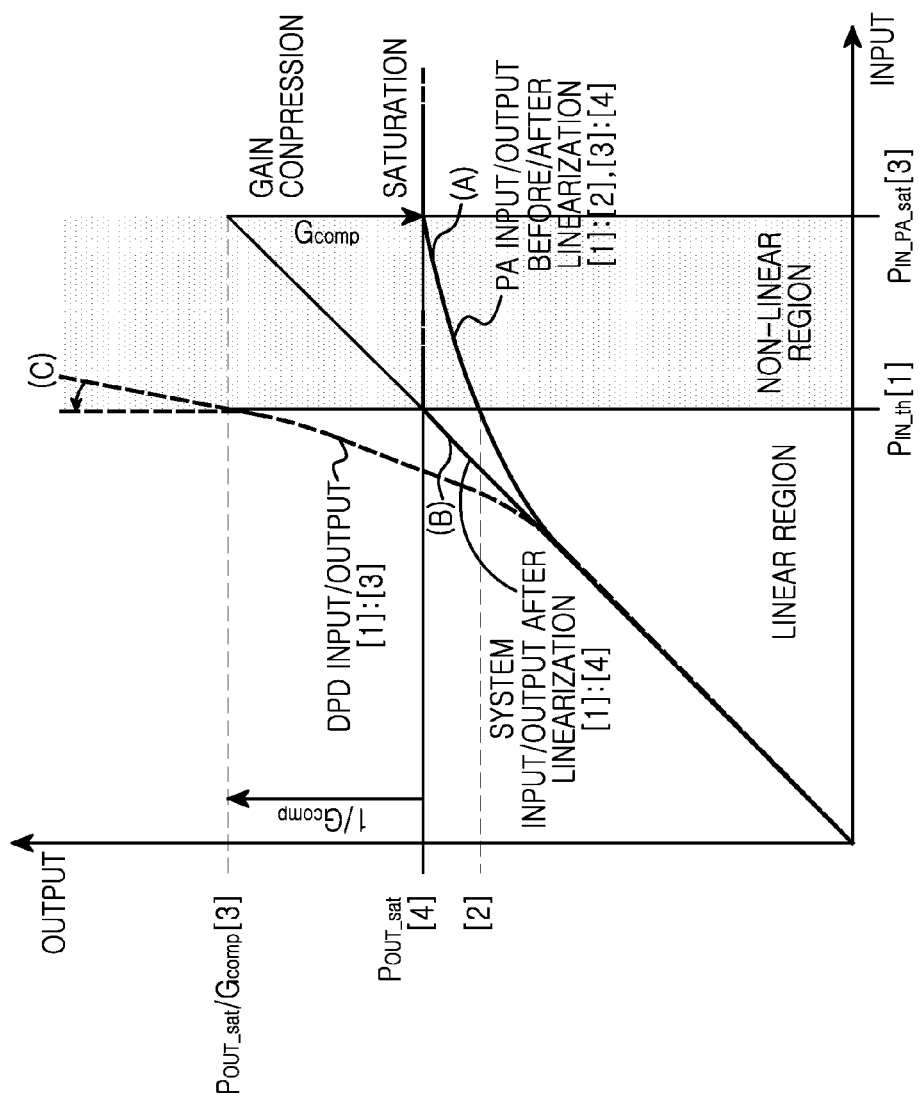
FIG. 3 is a graph illustrating input/output characteristics the conventional power amplifiers illustrated in FIG. 2.
Figure 4:
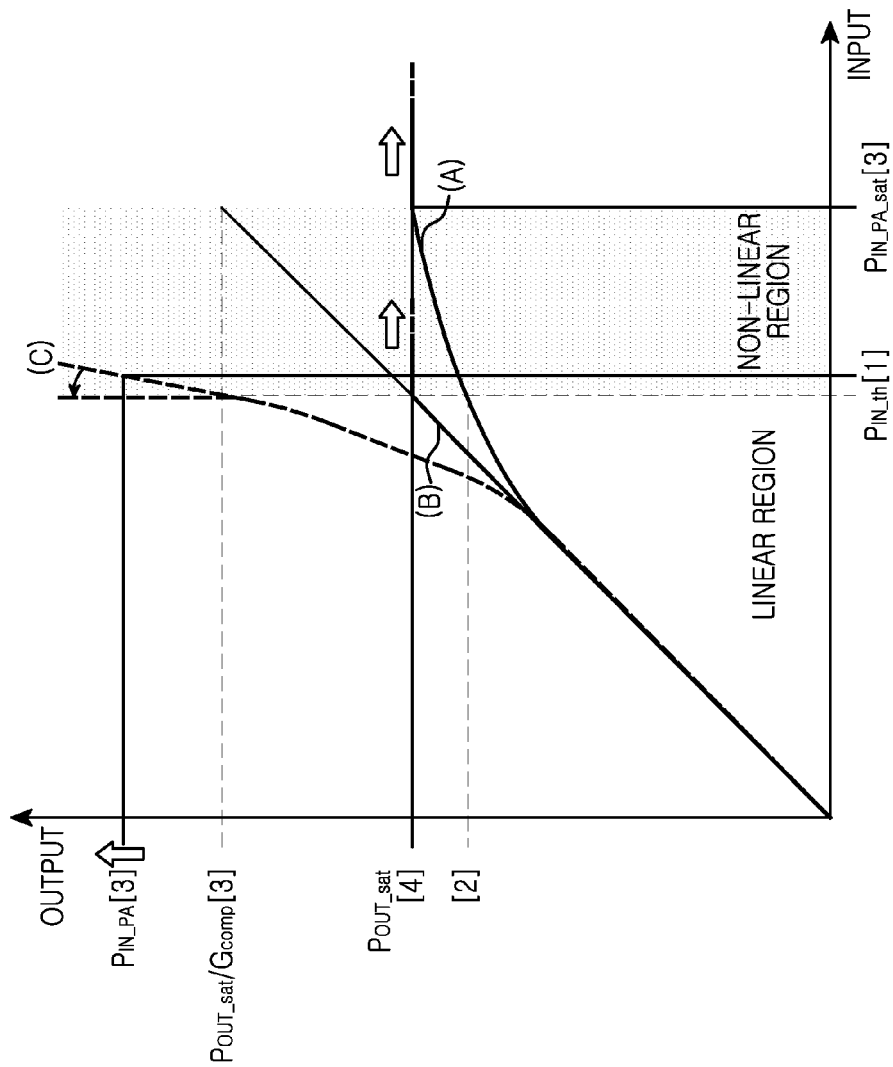
FIG. 4 is a graph illustrating input/output characteristics of the conventional digital amplifiers illustrated in FIG. 2, when a system input value of $P_{IN\_th}$ or more is applied.

Referring to FIG. 5, the operations of an up-converter 217 and a down-converter 230 are the same as those illustrated in FIG. 1.

A power amplifier 220 amplifies a signal by $G_{PA}$, and an attenuator 225 attenuates an output signal of the power amplifier 220 by $1/G_{PA}$.

A digital unit 200 includes a Peak Level Detector (PLD) 214 that detects a peak level of an output signal of the power amplifier 220. To prevent saturation of the power amplifier 220 via the PLD 214, a Saturation Level Limiter (SLL) 215 is added the DPD 210.

When rated power is applied to the system, the PLD 214 operates. When a peak level of the power amplifier 220 is found via the PLD 214, the DPD operates the SLL to prevent saturation of the power amplifier 200 by limiting an input to the up-converter 217 to be no greater than a threshold value based on the peak level of the power amplifier 220. This operation will be described in more detail below with reference to FIG. 5.

The digital unit 200 denotes a unit where digital operations are possible. Generally, a Central Processing Unit (CPU) may perform all or some of the functions of the DPD 210, the SLL 215, the PLD 214, and the corrector 235.

Figure 6:
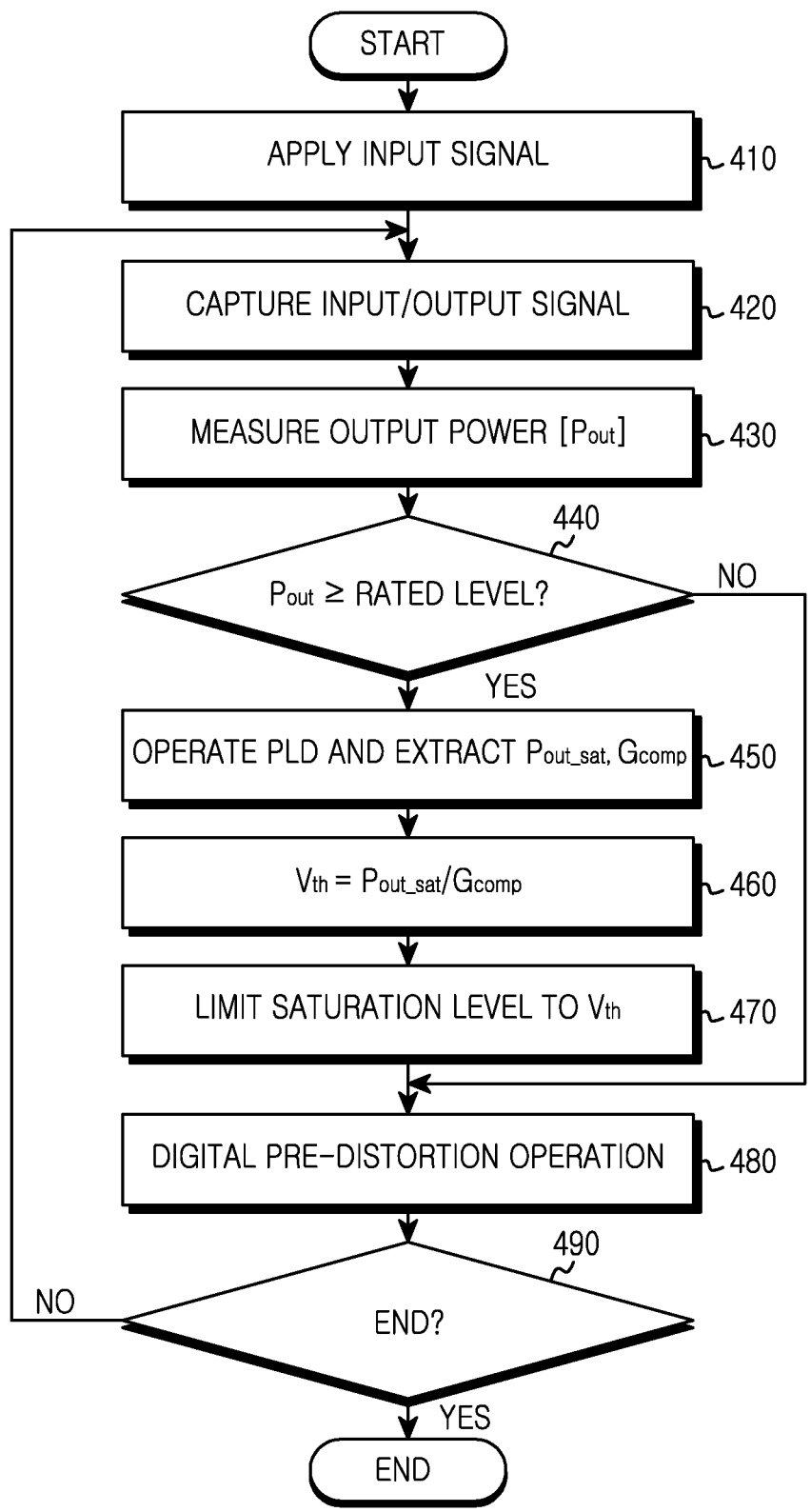
FIG. 6 is a flowchart illustrating a digital pre-distortion operation according to an embodiment of the present invention.

FIG. 6 is a flowchart illustrating a digital pre-distortion operation according to an embodiment of the present invention.

Referring to FIG. 6, when a system operation starts, an input signal is applied to a DPD in step 410. The DPD captures an input/output signal required for digital pre-distortion adaptation in step 420.

The DPD determines an output power $P_{OUT}$ via the captured signal in step 430. When the output power $P_{OUT}$ is equal to or greater than a desired rated level in step 440, a PLD and an SLL are operated.

More specifically, when the output power $P_{OUT}$ is greater than or equal to a desired rated level in step 440, the PLD sets a captured peak value of an output power as $P_{out\_sat}$, and determines a gain reduction $G_{comp}$ upon saturation for this value in step 450. The gain reduction $G_{comp}$ upon saturation may be easily determined via a ratio of an input/output gain upon $P_{out\_sat}$ output over an average input/output gain. $P_{out\_sat}$ continues to increase as iteration time of the DPD increases, and has a constant value when saturation occurs.

In step 460, the PLD determines a limiting threshold value $V_{th}$ to be used by the SLL, based on $P_{out\_sat}$ and $G_{comp}$. When the limiting threshold value $V_{th}$ is determined, in step 470, the DPD operates the SLL to prevent saturation of a power amplifier by limiting an input of the power amplifier to be no greater than the threshold value. That is, when a peak signal for an output signal of the power amplifier is detected by the PLD, and the SLL is operated using a value obtained by dividing the peak signal by $G_{comp}$ (gain reduction upon saturation), i.e., $P_{out\_sat}/G_{comp}$ P as the limiting threshold value $V_{th}$, a value of no greater than $V_{th}$ is applied to the power amplifier.

An adaptive control operation of the DPD is performed in step 480, and the above operation iterates until the procedure ends in step 490.

Using the method illustrated in FIG. 6, a power transmission system may perform stable linearization without divergence by saturation and input.

Alternatively, the limiting threshold value may be an arbitrary value.

Figure 7:
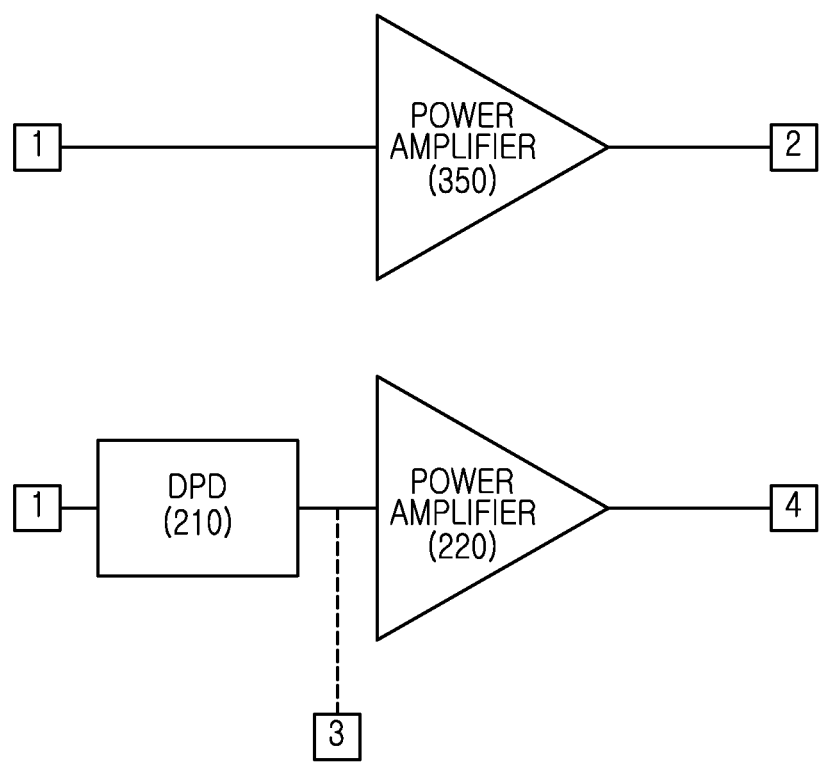
FIG. 7 illustrates a conventional power amplifier with no digital pre-distortion operation applied to the input thereof and a power amplifier with digital a digital pre-distortion operation applied to the input thereof, according to an embodiment of the present invention.

FIG. 7 illustrates a conventional power amplifier and a power amplifier in a digital pre-distortion transmission system according to an embodiment of the present invention. Specifically, FIG. 7 illustrates a conventional power amplifier 350 with no digital pre-distortion operation applied to the input thereof and a power amplifier 220 with digital a digital pre-distortion operation applied to the input thereof by DPD 210.

Figure 8:
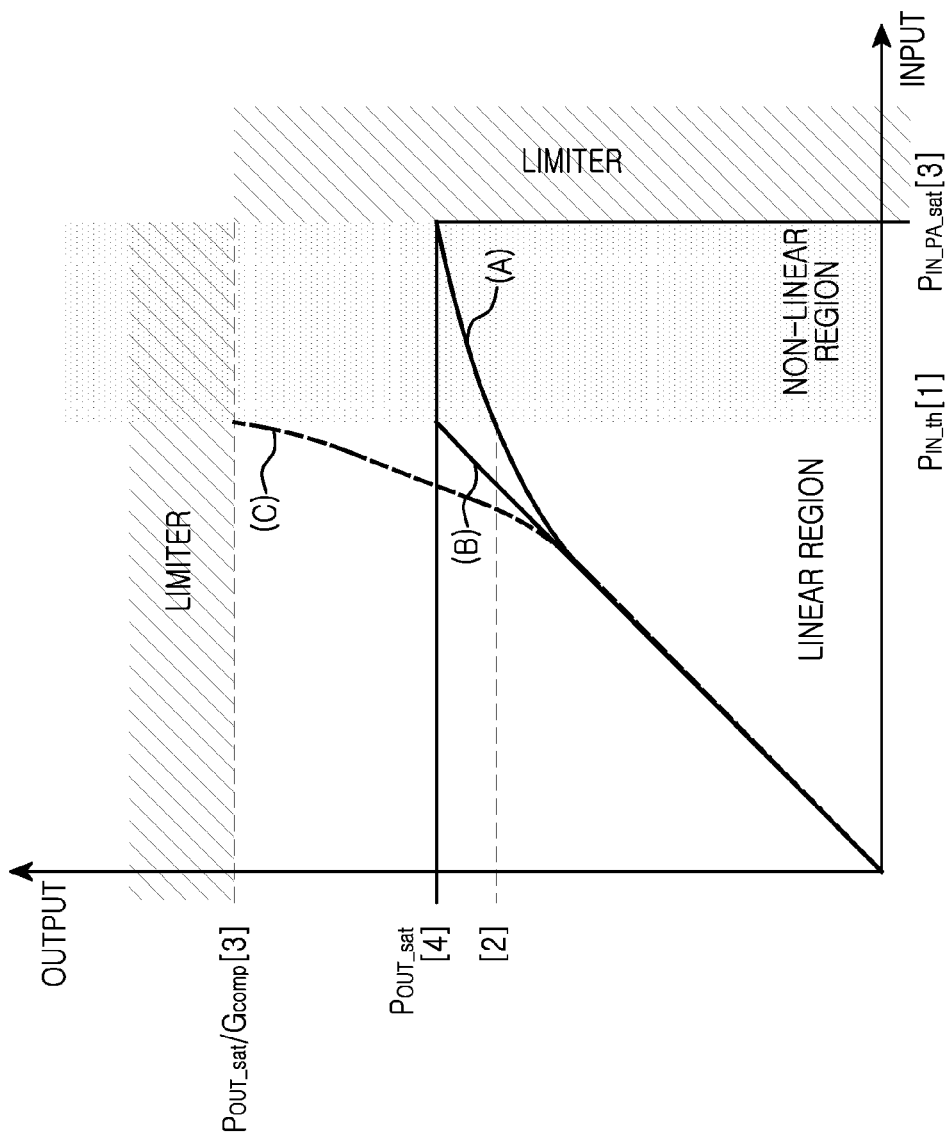
FIG. 8 is a graph illustrating input/output characteristics of the amplifiers illustrated in FIG. 7, when a saturation level limiter is used, according to an embodiment of the present invention.

When the gains of power amplifiers 350 and 220 are normalized to 1, input/output characteristics for ports 1, 2, 3, and 4 are illustrated in FIG. 8.

FIG. 8 is a graph illustrating input/output characteristics of the amplifiers illustrated in FIG. 7, when a saturation level limiter is used, according to an embodiment of the present invention.

Referring to FIG. 8, when a peak signal for an output signal of a power amplifier is detected by a PLD, and an SLL is operated using a value obtained by dividing the peak signal by $G_{comp}$ (gain reduction upon saturation), i.e., $P_{out\_sat}/G_{comp}$ as the limiting threshold value $V_{th}$, a value no greater than $V_{th}$ is applied to the power amplifier.

Consequently, a saturation state operation of the power amplifier may be prevented, and because the DPD does not use a saturation value as an inverse function, a phenomenon that an input value of the power amplifier increases may be prevented.

Through this operation, application of an input of the amplifier to a non-linear region may be prevented as illustrated in FIG. 8, such that a stable digital pre-distortion power transmission system without a saturation operation may be realized.

The above-described embodiments of the present invention limit an input signal of a power amplifier to a limiting threshold value in order to prevent a phenomenon, such as an excessive input or an undesired performance deterioration of the power amplifier, saturation by deviation for each sample, etc., and an input increase by this, divergence, etc., in a digital pre-distortion system, so that saturation of the power amplifier is prevented and a stable performance may be obtained.

Although the present invention has been shown and described with reference to certain embodiments thereof, it will be understood by those skilled in the art that various changes in form and details may be made therein without departing from the spirit and scope of the present invention as defined by the appended claims and their equivalents.

What is claimed is:

1. A method for operating a digital pre-distortion system including a power amplifier, the method comprising:

performing a digital pre-distortion operation;
determining a peak value of an output power of the power amplifier and a gain reduction upon saturation for the peak value:
determining a limit threshold using the peak value and the gain reduction upon saturation; and
limiting an input of the power amplifier not to be greater than the limit threshold.

2. The method of claim 1, wherein the peak value of the output power of the power amplifier and the gain reduction upon saturation for the peak value are determined when the output power of the power amplifier is greater than or equal to a predetermined rated level.

3. The method of claim 1, wherein the gain reduction upon saturation includes a ratio of an input/output gain upon output of the peak value to an average input/output gain.

4. The method of claim 1, wherein the peak value continues to increase as an iteration time of a digital pre-distortion operation increases and has a constant value when saturation of the output of the power amplifier occurs.

5. The method of claim 1, wherein the limit threshold includes a value obtained by dividing the peak value by the gain reduction upon saturation.

6. The method of claim 1, wherein the limit threshold includes an arbitrary value.

7. An apparatus for operating a digital pre-distortion system, the apparatus comprising:

a power amplifier;
a Digital Pre-Distorter (DPD) for performing a digital pre-distortion operation; and
a controller for limiting an input of the power amplifier not to be greater than a limit threshold,
wherein the controller determines a peak value of an output power of the power amplifier and a gain reduction upon saturation for the peak value, and determines the limit threshold using the peak value and the gain reduction upon saturation.

8. The apparatus of claim 7, wherein the controller determines the peak value of the output power of the power amplifier and the gain reduction upon saturation for the peak value, when the output power of the power amplifier is greater than or equal to a predetermined rated level.

9. The apparatus of claim 7, wherein the gain reduction upon saturation comprises a ratio of an input/output gain upon output of the peak value to an average input/output gain.

10. The apparatus of claim 7, wherein the peak value continues to increase as an iteration time of a digital pre-distortion operation increases and has a constant value when saturation of the output of the power amplifier occurs.

11. The apparatus of claim 7, wherein the limit threshold comprises a value obtained by dividing the peak value by the gain reduction upon saturation.

12. The apparatus of claim 7, wherein the limit threshold comprises an arbitrary value.

* * * * *